(12) United States Patent
Kim et al.

(10) Patent No.: US 9,960,380 B2
(45) Date of Patent: *May 1, 2018

(54) ORGANIC LIGHT EMITTING DIODE AND ORGANIC LIGHT EMITTING DISPLAY DEVICE INCLUDING THE SAME

(71) Applicant: SAMSUNG DISPLAY CO., LTD., Yongin-si, Gyeonggi-do (KR)

(72) Inventors: Dong Chan Kim, Yongin-si (KR); Won Jong Kim, Yongin-si (KR); Eung Do Kim, Yongin-si (KR); Dong Kyu Seo, Yongin-si (KR); Da Hea Im, Yongin-si (KR); Sang Hoon Yim, Yongin-si (KR); Chang Woong Chu, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/599,263

(22) Filed: May 18, 2017

(65) Prior Publication Data

US 2017/0256734 A1 Sep. 7, 2017

Related U.S. Application Data

(63) Continuation of application No. 14/825,360, filed on Aug. 13, 2015, now Pat. No. 9,660,214.

(30) Foreign Application Priority Data

Dec. 24, 2014 (KR) .................. 10-2014-0188947

(51) Int. Cl.
*H01L 51/50* (2006.01)
*H01L 27/32* (2006.01)
*H01L 51/00* (2006.01)

(52) U.S. Cl.
CPC ...... *H01L 51/5092* (2013.01); *H01L 27/3211* (2013.01); *H01L 27/3276* (2013.01); (Continued)

(58) Field of Classification Search
CPC .................................. H01L 51/0032–51/0095
See application file for complete search history.

(56) References Cited

U.S. PATENT DOCUMENTS

| 5,677,572 A | 10/1997 | Hung et al. |
| 2005/0285101 A1* | 12/2005 | Hanson ............... B82Y 10/00 257/40 |

(Continued)

FOREIGN PATENT DOCUMENTS

| KR | 10-2007-0071978 A | 7/2007 |
| KR | 10-2014-0001581 A | 1/2012 |
| KR | 10-2012-0085226 A | 7/2012 |

OTHER PUBLICATIONS

Wu, Chih-I, et al., "Energy Structures and chemical reactions at the Ai/Li F/Al q 3 interfaces studied by synchrotron-radiation photoemission spectroscopy", Applied Physics Letters 87, 212108 (2005).

(Continued)

*Primary Examiner* — Mamadou Diallo
(74) *Attorney, Agent, or Firm* — Lee & Morse, P.C.

(57) ABSTRACT

An organic light emitting diode and an organic light emitting display device, the organic light emitting diode including a first electrode and a second electrode facing each other; an emission layer between the first electrode and the second electrode; and a hole transport layer between the first electrode and the emission layer, wherein the hole transport layer includes an organic material and a dipole material, the dipole material including a first component and a second component, the first component having a polarity different (Continued)

from that of the second component and the first component and the second component being combined with each other.

24 Claims, 8 Drawing Sheets

(52) U.S. Cl.
CPC .......... *H01L 51/504* (2013.01); *H01L 51/506* (2013.01); *H01L 51/5056* (2013.01); *H01L 51/0061* (2013.01); *H01L 51/0072* (2013.01); *H01L 51/0073* (2013.01); *H01L 51/0074* (2013.01); *H01L 2251/301* (2013.01)

(56) References Cited

U.S. PATENT DOCUMENTS

| | | | |
|---|---|---|---|
| 2008/0142794 A1* | 6/2008 | Shitagaki | H01L 51/5048 257/40 |
| 2011/0240964 A1* | 10/2011 | Ko | H01L 27/3248 257/40 |
| 2012/0118368 A1* | 5/2012 | Huang | B82Y 10/00 136/256 |
| 2013/0015424 A1* | 1/2013 | Chung | H01L 51/52 257/9 |
| 2015/0340629 A1* | 11/2015 | Wang | H01L 51/50 257/40 |
| 2015/0357584 A1* | 12/2015 | Zou | H01L 51/0061 257/40 |
| 2016/0056387 A1* | 2/2016 | Kim | H01L 51/5088 257/40 |

OTHER PUBLICATIONS

Liu, Wenbo, et al., "Efficient inverted organic light-emitting devices with self or intentionally Ag-doped interlayer modified cathode", Applied Physics Letters 104, 093305 (2014).

* cited by examiner

ORGANIC LIGHT EMITTING DIODE AND ORGANIC LIGHT EMITTING DISPLAY DEVICE INCLUDING THE SAME

CROSS-REFERENCE TO RELATED APPLICATIONS

This is a continuation application based on pending application Ser. No. 14/825,360, filed Aug. 13, 2015, the entire contents of which is hereby incorporated by reference.

Korean Patent Application No. 10-2014-0188947, filed on Dec. 24, 2014, in the Korean Intellectual Property Office, and entitled: "Organic Light Emitting Diode and Organic Light Emitting Display Device Including the Same," is incorporated by reference herein in its entirety.

BACKGROUND

1. Field

Embodiments relate to an organic light emitting diode and an organic light emitting display device including the same.

2. Description of the Related Art

Recently, with an increased demand for weight reduction and slimness of a monitor, a television, or the like, a cathode ray tube (CRT) is being replaced by a liquid crystal display (LCD). However, the liquid crystal display is a light receiving device and therefore requires a separate backlight and has a limitation in a response speed, a viewing angle, and the like.

As s display device which may overcome the limitations, an organic light emitting display device having advantages of a wide viewing angle, an excellent contrast, and a rapid response time as a self-luminous display device has been considered.

The organic light emitting display device may include an organic light emitting diode that emits light, in which the organic light emitting diode emits light by combining electrons injected from one electrode with holes injected from another electrode in an emission layer to form excitons and letting the excitons emit energy.

The above information disclosed in this Background section is only for enhancement of understanding of the background of the invention and therefore it may contain information that does not form the prior art that is already known in this country to a person of ordinary skill in the art.

SUMMARY

Embodiments are directed to an organic light emitting diode and an organic light emitting display device including the same.

The embodiments may be realized by providing an organic light emitting diode, including a first electrode and a second electrode facing each other; an emission layer between the first electrode and the second electrode; and a hole transport layer between the first electrode and the emission layer, wherein the hole transport layer includes an organic material and a dipole material, the dipole material including a first component and a second component, the first component having a polarity different from that of the second component and the first component and the second component being combined with each other.

The first component may include a metal or a non-metal and has a work function of 4.0 eV or more, and the second component may include a halogen.

The first component may include an element selected from Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, In, and Zn.

The second component may include an element selected from F, Cl, Br, and I.

The dipole material may include one selected from $NiI_2$, $CoI_2$, $CuI$, $AgI$, $SnI_2$, and $InI_3$.

The organic light emitting diode may further include an electron injection layer between the emission layer and the second electrode, wherein the electron injection layer has a work function of 3.0 eV or less, and includes at least one selected from an alkali metal, an alkaline earth metal, a rare earth element, a transition metal, or an alloy thereof.

The electron injection layer may include at least one selected from Li, Na, K, Rb, Cs, Ca, Sr, Ba, Ce, Sm, Eu, Gd, Yb, and an alloy thereof.

A dipole moment of the first component and the second component may be 5 Debye or greater.

The first component may include at least one selected from an alkali metal, an alkaline earth metals, a rare earth element, a transition metal, and an alloy thereof, and the second component may include a halogen.

The first component may have a work function of 3.0 eV or less, and may include at least one selected from Li, Na, K, Rb, Cs, Ca, Sr, Ba, Ce, Sm, Eu, Gd, and Yb, and an alloy thereof.

The organic light emitting diode may further include a hole injection layer between the first electrode and the hole transport layer, wherein the hole injection layer includes an organic material and another dipole material, the other dipole material including a third component and a fourth component, the third component having a polarity different from that of the fourth component, and the third component and the fourth component being combined with each other.

The third component may include a metal or a non-metal having a work function of 4.0 eV or more, and the fourth component may include a halogen.

The hole transport layer or the hole injection layer may have a structure formed of a plurality of layers and when the organic material and the dipole material each are a first material and a second material, the plurality of layers may each comprise at least one of the first material and the second material.

The hole transport layer may be formed by a co-depositing the organic material and the dipole material.

The embodiments may be realized by providing an organic light emitting display device including a substrate, a gate line on the substrate; a data line and a driving voltage line intersecting the gate line; a switching thin film transistor connected to the gate line and the data line; a driving thin film transistor connected to the switching thin film transistor and the driving voltage line; and an organic light emitting diode connected to the driving thin film transistor, wherein the organic light emitting diode includes a first electrode and a second electrode facing each other; an emission layer between the first electrode and the second electrode; and a hole transport layer between the first electrode and the emission layer, and wherein the hole transport layer includes an organic material and a dipole material, the first component having a polarity different from that of the second component and the first component and the second component being combined with each other.

The first component may include a metal or a non-metal, the metal or non-metal having a work function of 4.0 eV or more, and the second component may include halogen.

The first component may include an element selected from Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, In, and Zn.

The second component may include an element selected from F, Cl, Br, and I.

The dipole material may include one selected from $NiI_2$, $CoI_2$, CuI, AgI, $SnI_2$, and $InI_3$.

A dipole moment of the first component and the second component may be 5 Debye or greater.

The first component may include at least one selected from an alkali metal, an alkaline earth metals, a rare earth element, a transition metal, and an alloy thereof, and the second component may include a halogen.

The first component may have a work function of 3.0 eV or less, and may include at least one selected from Li, Na, K, Rb, Cs, Ca, Sr, Ba, Ce, Sm, Eu, Gd, and Yb, and an alloy thereof.

The emission layer may include a red emission layer, a green emission layer, and a blue emission layer and the organic light emitting display device may further include an auxiliary layer on a lower end of the blue emission layer.

The auxiliary layer may include a compound represented by the following Chemical Formula 1:

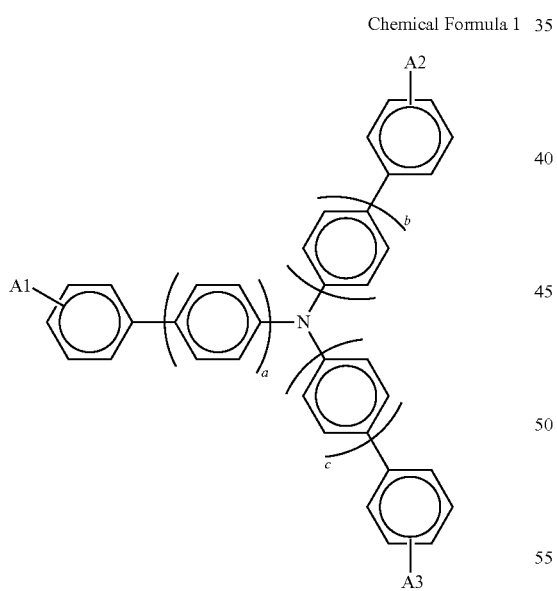

Chemical Formula 1 wherein, in Chemical Formula 1, A1, A2, and A3 may each independently include an alkyl group, an aryl group, a carbazole group, a dibenzothiophene group, a dibenzofuran group, or a biphenyl group, and a, b, and c may each independently be an integer of 0 to 4.

The auxiliary layer may include a compound represented by the following Chemical Formula 2:

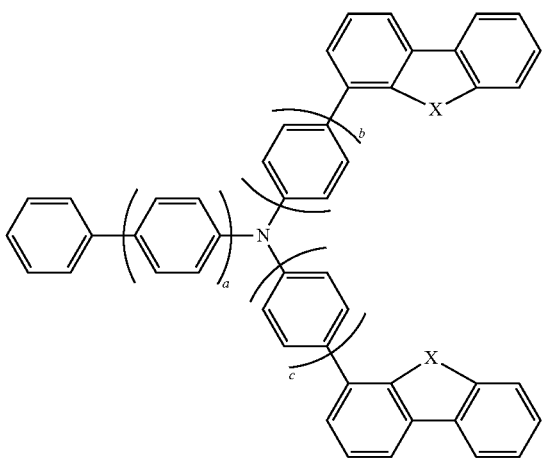

Chemical Formula 2 wherein, in Chemical Formula 2, a, b, and c may each independently be an integer of 0 to 3, and each X may independently be selected from O, N, and S.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
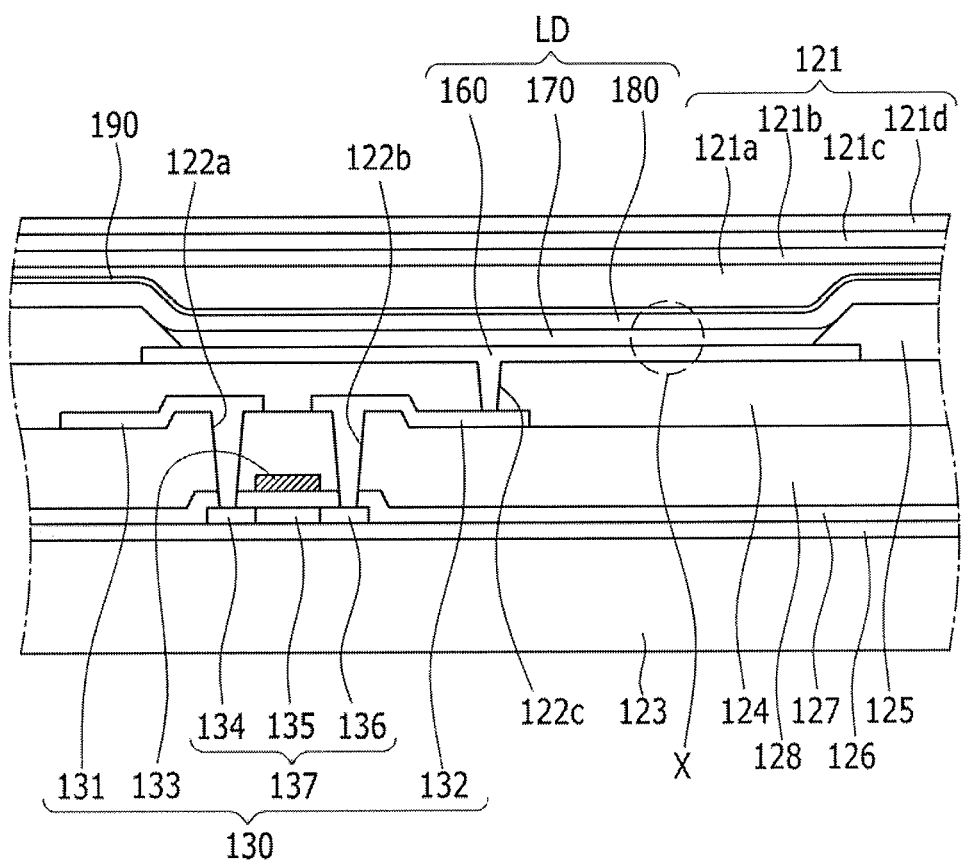
FIG. 1 illustrates a cross-sectional view of an organic light emitting display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Hereinafter, an organic light emitting display device as an example to which an organic light emitting diode according to an exemplary embodiment is applied will be described.

Figure 2:
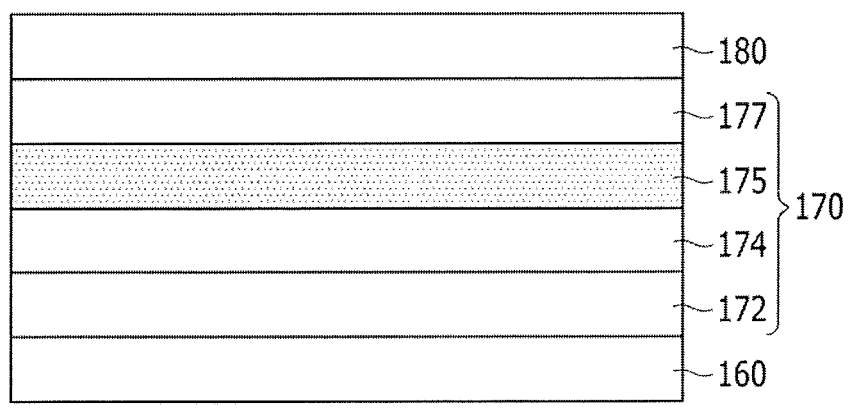
FIG. 2 illustrates an enlarged cross-sectional view of an organic light emitting diode of FIG. 1.

FIG. 1 illustrates a cross-sectional view of an organic light emitting display device according to an exemplary embodiment. FIG. 2 illustrates a partially enlarged cross-sectional view of an organic light emitting diode of FIG. 1.

Referring to FIGS. 1 and 2, an organic light emitting display device according to an exemplary embodiment may include a substrate 123, a thin film transistor 130, a first electrode 160, a light emitting device layer 170, and a second electrode 180. The first electrode 160 may be an anode and the second electrode 180 may be a cathode, or the first electrode 160 may be a cathode and the second electrode 180 may be an anode.

Here, a substrate 123 may be made of, e.g., inorganic materials such as glass, organic materials such as polycarbonate, polymethyl methacrylate, polyethylene terephthalate, polyethylene naphthalate, polyamide, polyethersulfone or a mixture thereof, a silicon wafer, and the like.

A substrate buffer layer 126 may be disposed on the substrate 123. The substrate buffer layer 126 may help prevent a penetration of impurity elements and planarize a surface.

In this case, the substrate buffer layer 126 may be made of various materials which may perform the above functions. For example, as the substrate buffer layer 126, any one of a silicon nitride (SiNx) layer, a silicon oxide (SiOy) layer, a silicon oxynitride (SiOxNy) layer may be used. In an implementation, the substrate buffer layer 126 may be omitted depending on a kind of the substrate 123 and process conditions.

A driving semiconductor layer 137 may be formed on the substrate buffer layer 126. The driving semiconductor layer 137 may be made of a material including polysilicon. Further, the driving semiconductor layer 137 includes a channel region 135 which is not doped with impurities and a source region 134 and a drain region 136 formed by doping both sides of the channel region 135 with impurities. In this case, the doped ion material may include a P-type impurity such as boron (B) and as the doped ion material, e.g., $B_2H_6$, may be used. Here, the impurity may be changed depending on a kind of thin film transistor.

A gate insulating layer 127 made of silicon nitride (SiNx), silicon oxide (SiOy), or the like may be disposed on the driving semiconductor layer 137. A gate wire including a driving gate electrode 133 may be disposed on the gate insulating layer 127. Further, the driving gate electrode 133 may overlap at least a portion of the driving semiconductor layer 137, e.g., the channel region 135.

An interlayer insulating layer 128 covering the driving gate electrode 133 may be formed on the gate insulating layer 127. The gate insulating layer 127 and the interlayer insulating layer 128 may be provided with a first contact hole 122a and a second contact hole 122b through which the source region 134 and the drain region 136 of the driving semiconductor layer 137. Similar to the gate insulating layer 127, the interlayer insulating layer 128 may be made of materials of silicon nitride (SiNx), silicon oxide (SiOy), or the like.

Further, a data wiring including the driving source electrode 131 and the driving drain electrode 132 may be disposed on the interlayer insulating layer 128. Further, the driving source electrode 131 and the driving drain electrode 132 may be each connected to the source region 134 and the drain region 136 of the driving semiconductor layer 137 through the first contact hole 122a and the second contact hole 122b which are formed on the interlayer insulating layer 128 and the gate insulating layer 127.

As such, the driving thin film transistor 130, which includes the driving semiconductor layer 137, the driving gate electrode 133, the driving source electrode 131, and the driving drain electrode 132, may be formed. A configuration of the driving thin film transistor 130 may be variously changed to suitable configurations.

Further, a planarization layer 124 covering the data wire may be formed on the interlayer insulating layer 128. The planarization layer 124 may remove a step to planarize a surface, thereby increasing luminous efficiency of the organic light emitting diode formed thereon. Further, the planarization layer 124 may have a third contact hole 122c through which a portion of the drain electrode 132 is exposed.

The planarization layer 124 may be made of at least one material of a polyacrylate resin, an epoxy resin, a phenolic resin, a polyamide resin, a polyimide rein, an unsaturated polyester resin, a polyphenylenether resin, a polyphenylenesulfide resin, benzocyclobutene (BCB), and the like.

In an implementation, any one of the planarization layer 124 and the interlayer insulating layer 128 may be omitted.

The first electrode 160, e.g., the pixel electrode 160 of the organic light emitting diode may be disposed on the planarization layer 124. For example, the organic light emitting display device may include the plurality of pixel electrodes 160 which are disposed in a plurality of pixels, respectively. In this case, the plurality of pixel electrodes 160 may be spaced apart from each other. The pixel electrode 160 may be connected to the drain electrode 132 through the third contact hole 122c of the planarization layer 124.

A pixel defining layer 125 may be disposed on the planarization layer 124. An opening that exposes the pixel electrode 160 may be formed in the pixel defining layer. For example, the plurality of openings corresponding to each pixel may be formed between the pixel defining layers 125. The organic emission layers 170 may be disposed in each opening in the pixel defined layer 125. Therefore, the pixel area in which each light emitting device layer 170 is formed may be defined by the pixel defined layer 125.

In this case, the pixel electrode 160 may be disposed to correspond to the opening of the pixel defined layer 125. In an implementation, the pixel electrode 160 may not be disposed only in the opening of the pixel defined layer 125 but a portion of the pixel electrode 160 may be disposed under the pixel defined layer 125 to overlap the pixel defined layer 125.

The pixel defined layer 125 may be made of resin such as polyacrylate or polyimide, silica-based inorganic materials, and the like.

The light emitting device layer 170 may be disposed on the pixel electrode 160. A structure of the light emitting device layer 170 will be described below in greater detail.

The second electrode 180, e.g., a common electrode 180, may be disposed on the light emitting device layer 170. As such, the organic light emitting diode LD including the pixel electrode 160, the light emitting device layer 170, and the common electrode 180 may be formed.

In this case, the pixel electrode 160 and the common electrode 180 may each be made of transparent conductive materials or transflective or reflective conductive materials. The organic light emitting display device may be a top emission type, a bottom emission type, a both-sides emission type depending on a kind of materials forming the pixel electrode 160 and the common electrode 180.

As the organic layer, an overcoat 190 covering the common electrode 180 to protect the common electrode 180 may be formed on the common electrode 180.

Further, a thin film encapsulation layer 121 may be formed on the overcoat 190. The thin film encapsulation layer 121 may encapsulate the organic light emitting diode LD and a driving circuit unit formed on the substrate 123 from the outside to protect the organic light emitting diode LD and the driving circuit unit.

The thin film encapsulation layer 121 may include encapsulation organic layers 121a and 121c and encapsulation inorganic layers 121b and 121d which are alternately stacked with each other one by one. In an implementation, as illustrated in FIG. 1, e.g., two encapsulation inorganic layers 121a and 121c and two encapsulation inorganic layers 121b and 121d are alternately stacked with each other one by one to configure the thin film encapsulation layer 121.

Hereinafter, the organic light emitting diode according to an exemplary embodiment will be described with reference to FIG. 2.

Referring to FIG. 2, the organic light emitting diode (portion X of FIG. 1) according to the exemplary embodiment may include a structure in which the first electrode 160, a hole injection layer 172, a hole transport layer 174, an emission layer 175, an electron transport layer 177, and a second electrode 180 are sequentially stacked.

When the first electrode 160 is an anode, the anode may include a material having a high work function to facilitate hole injection. The first electrode 160 may be a transparent electrode or an opaque electrode. When the first electrode 160 is the transparent electrode, the first electrode 160 may be formed at a thin thickness using conductive oxide such as indium tin oxide (ITO), indium zinc oxide (IZO), tin oxide ($SnO_2$), zinc oxide (ZnO), or a combination thereof or metals such as aluminum, silver, and magnesium. When the first electrode 160 is the opaque electrode, the first electrode 160 may be formed using metals such as aluminum, silver, or magnesium.

The first electrode 160 may have a structure of at least two layers including different kinds of materials. For example, the first electrode 160 may be formed to have a structure in which indium tin oxide (ITO)/silver (Ag)/indium tin oxide (ITO) are sequentially stacked.

The first electrode 160 may be formed by, e.g., a sputtering method, a vacuum deposition method, or the like.

The hole injection layer 172 on the first electrode 160 may help improve the hole injection from the first electrode 160 into the hole transport layer 174. According to the exemplary embodiment, the hole injection layer 172 may include an organic material and a dipole material. In an implementation, the dipole material may include a third component and a fourth component having different polarities and that are combined with each other, e.g., the third component and the fourth component may be combined with each other, and the third component may have a polarity different from the polarity of the fourth component. Here, when the dipole material is ionized, the third component may be a cation element and the fourth component may be an anion element. In an implementation, the third component may be one element, the fourth component may be another element, and the elements may be bound to form a compound of the dipole material.

In an implementation, the third component may include, e.g., a metal or a non-metal and may have a work function of 4.0 eV or more. In an implementation, the third component may include an element selected from, e.g., Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, In, and Zn.

The fourth component may include a halogen. The fourth component may include, e.g., F, Cl, Br, or I.

In an implementation, the dipole material may include one selected from, e.g., $NiI_2$, $CoI_2$, CuI, AgI, $SnI_2$ and $InI_3$. In an implementation, the dipole material may include a compound in which the first component and the second component as described above are combined with each other.

In an implementation, the organic material included in the hole injection layer 172 may include, e.g., NPD (N,N-dinaphthyl-N,N'-diphenyl benzidine), TPD (N,N'-bis-(3-methylphenyl)-N,N'-bis-(phenyl)-benzidine), s-TAD, MTDATA (4,4',4''-Tris (N-3-methylphenyl-N-phenyl-amino)-triphenylamine), or the like.

In an implementation, the dipole material and the organic material included in the hole injection layer may be formed by co-deposition, e.g., the hole injection layer may be formed by co-depositing the dipole material and the organic material.

In the organic light emitting diode (LD) according to the exemplary embodiment, the hole injection layer 172 (having strong dipole characteristics) may be disposed at an interface between the first electrode 160 (made of the inorganic materials) and organic material layers (e.g., the hole transport layer 174 or the emission layer 175). Therefore, a vacuum level of the organic material layer may be shifted and thus a hole injection barrier may be reduced. In this case, an electric field may be increased at the interface and thus the hole may be tunneled.

For example, when the dipole material (including a metal or a non-metal (element) and having the work function (high work function) of 4.0 eV or more and a halogen combined with each other) is dissociated at the interface, the carrier injection barrier including holes may be reduced due to the element having a high work function. When the element having the high work function is oxidized and thus electrons are captured at the interface, holes in which electrons are emptied may be formed in the organic material layer to form a region like a p-doped interface region, thereby forming the hole injection layer.

A halogen ion dissociated at the dipole material may help prevent In and Sn ions (included in an ITO material that forms the first electrode 160) from moving to the organic material layer to help prevent the organic material layer from being crystallized. In addition, the halogen ion may cover a pin-hole generated at an ITO surface to help reduce a swelling phenomenon due to an encounter of Ag and S in the air A thickness of the hole injection layer 172 may range from, e.g., 0.5 nm to 50 nm. In an implementation, a thickness of the hole injection layer 172 may range from, e.g., 25 nm to 35 nm.

The hole transport layer 174 may be on the hole injection layer 172. The hole transport layer 174 may help smoothly transport holes transferred from the hole injection layer 172. According to the exemplary embodiment, the hole transport layer 174 may include an organic material and the dipole material (in which a first component and a second component having different polarities are combined with each other). In an implementation, when the dipole material is ionized, the first component may be a cation element and the second component may be an anion element. The organic material included in the hole transport layer 174 may include, e.g., NPD (N,N-dinaphthyl-N,N'-diphenyl benzidine), TPD (N,N'-bis-(3-methylphenyl)-N,N'-bis-(phenyl)- benzidine), s-TAD, MTDATA (4,4',4"-Tris (N-3-methylphenyl-N-phenyl-amino)-triphenylamine), or the like.

According to the exemplary embodiment, the first component may include a metal or a non-metal and may have a work function of 4.0 eV or more. In an implementation, the first component may include an element selected from, e.g., Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, In, and Zn.

The second component may include a halogen. The second component may include, e.g., F, Cl, Br, or I.

In an implementation, the dipole material may include, e.g., $NiI_2$, $CoI_2$, CuI, AgI, $SnI_2$, or $InI_3$. In an implementation, the dipole material may be a compound in which the first component and the second component as described above are combined or bound with each other. For example, the first component may be one element, the second component may be another element, and the elements may be bound together to form a compound of the dipole material.

In an implementation, the thickness of the hole injection layer 174 may be, e.g., from 0.5 nm to 50 nm. In an implementation, the thickness of the hole injection layer 174 may range from, e.g., 15 nm to 25 nm.

According to the exemplary embodiment, the hole transport layer 174 may be formed by co-depositing the organic material and the dipole material. According to the exemplary embodiment, when the dipole material having the high work function and the organic material are co-deposited, dipole molecules (which may be uniformly present at an organic molecular interface) may activate a polarization phenomenon due to the electric field and may deprive the organic material of electrons to cause a P doping phenomenon. For example, when the dipole is dissociated, remaining element having the high work function may help reduce the hole injection barrier to smooth the hole injection.

In an implementation, the hole injection layer 172 and the hole transport layer 174 may be stacked or the hole injection layer 172 and the hole transport layer 174 may be formed as a single layer.

The emission layer 175 may be disposed on the hole transport layer 174. The emission layer 175 may include a light emitting material representing a specific color. For example, the emission layer 175 may represent a primary color such as blue, green, and red, or a combined color thereof.

A thickness of the emission layer 175 may range from, e.g., 10 nm to 50 nm. The emission layer 175 may include a host and dopant. The emission layer 175 may include a material emitting red, green, blue, and white light and may be formed using phosphorous materials or fluorescent materials.

When the emission layer 175 emits red light, e.g., the emission layer 175 may include host materials including CBP (carbazole biphenyl) or mCP (1,3-bis(carbazol-9-yl)), and may be made of dopant including at least any one selected from PIQIr (acac) (bis (1-phenylisoquinoline)acetylacetonate iridium), PQIr (acac) (bis (1-phenylquinoline) acetylacetonate iridium), PQIr (tris (1-phenylquinoline) iridium), and PtOEP (octaethylporphyrin platinum), or may be made of fluorescent materials including PBD:Eu (DBM) 3(Phen) or perylene.

When the emission layer 175 emits green light, e.g., the emission layer 175 may include host materials including the CBP or the mCP and may be made of the phosphorous material including the dopant material including the $Ir(ppy)_3$ (fac-tris (2-phenylpyridine)iridium), or may be made of fluorescent materials including Alq3(tris (8-hydroxyquinolino)aluminum).

When the emission layer 175 emits blue light, e.g., the emission layer 175 may include a host material including the CBP or the mCP and may be made of phosphorus materials including the dopant material including the $(4,6-F_2ppy)_2Irpic$. In an implementation, the emission layer 175 may be made of fluorescent materials including any one selected from spiro-DPVBi, Spiro-6P, distill benzene (DSB), display trills arylene (DSA), PFO-based polymer, and PPV-based polymer.

The electron transport layer 177 may be disposed on the emission layer 175. The electron transport layer 177 may transfer electrons from the second electrode 180 to the emission layer 175. Further, the electron transport layer 177 may help prevent the holes injected from the first electrode 160 from moving to the second electrode 180 through the emission layer 175. For example, the electron transport layer 177 may serve as a hole blocking layer to help combine holes with electrons at the emission layer 175.

In an implementation, the electron transport layer 177 may include an organic material. For example, the electron transport layer 177 may include one selected from Alq3 (tris (8-hydroxyquinolino)aluminum), PBD, TAZ, Spiro-PBD, BAlq, and SAlq.

The second electrode 180 may be disposed on the electron transport layer 177. When the second electrode 180 is a cathode, the second electrode 180 may include a material having a low work function to facilitate the electron injection. For example, the material may include metals such as magnesium, calcium, sodium, potassium, titanium, indium, yttrium, lithium, gadolinium, aluminum, silver, tin, lead, cesium, and barium or an alloy thereof and multi-layered structure materials such as LiF/Al, $LiO_2$/Al, LiF/Ca, LiF/Al and $BaF_2$/Ca. The second electrode 180 may include, e.g., lithium (Li), magnesium (Mg), aluminum (Al), aluminum-lithium (Al—Li), calcium (Ca), silver (Ag), magnesium-silver (Mg—Ag), or the like.

When the foregoing second electrode 180 is made of alloy, an alloy ratio may be controlled depending on temperature, atmosphere, vacuum, and the like of a deposition source and may be selected at an appropriate ratio.

The second electrode 180 may also be configured of two layers or more.

Figure 3:
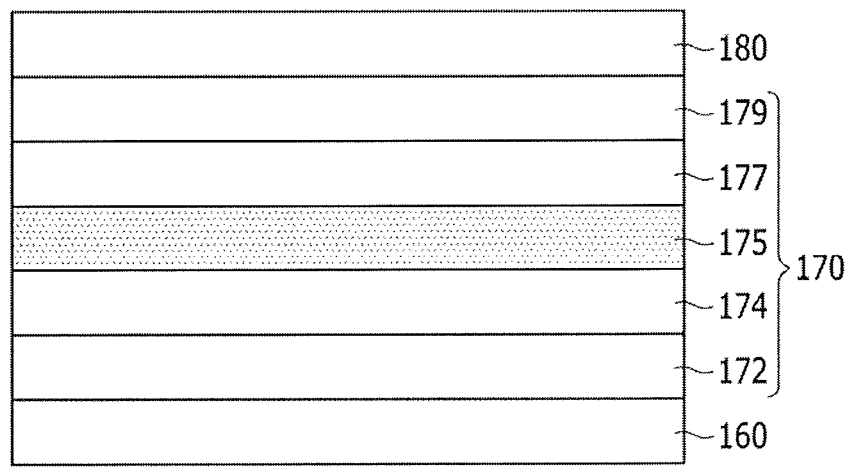
FIG. 3 illustrates a cross-sectional view of an example in which the organic light emitting diode of FIG. 2 is partially modified.

FIG. 3 illustrates a cross-sectional view of an example in which the organic light emitting diode of FIG. 2 is partially modified.

FIG. 3 illustrates a structure in which the organic light emitting diode (LD) according to the exemplary embodiment of FIG. 2 further includes an electron injection layer 179. For example, the electron injection layer 179 may be disposed between the electron transport layer 177 and the second electrode 180. The electron injection layer 179 may facilitate injection of electrons from the second electrode 180 into the electron transport layer 177. In an implementation, the electron injection layer 179 may include a metal material having a low work function. The work function of the metal material forming the electron injection layer 179 may be equal to or less than 3.0 eV. For example, the electron injection layer 179 may include an alkali metal, alkaline earth metal, rare earth element, alkali metal oxide, alkaline earth metal oxide, rare earth oxide, or an alloy thereof. For example, the electron injection layer 179 may include at least one selected from, e.g., Li, Na, K, Rb, Cs, Ca, Sr, Ba, Ce, Sm, Eu, Gd, and Yb and/or an alloy thereof.

In addition to the foregoing difference, the content described with reference to FIG. 2 may be applied to the exemplary embodiment of FIG. 3.

Figure 4:
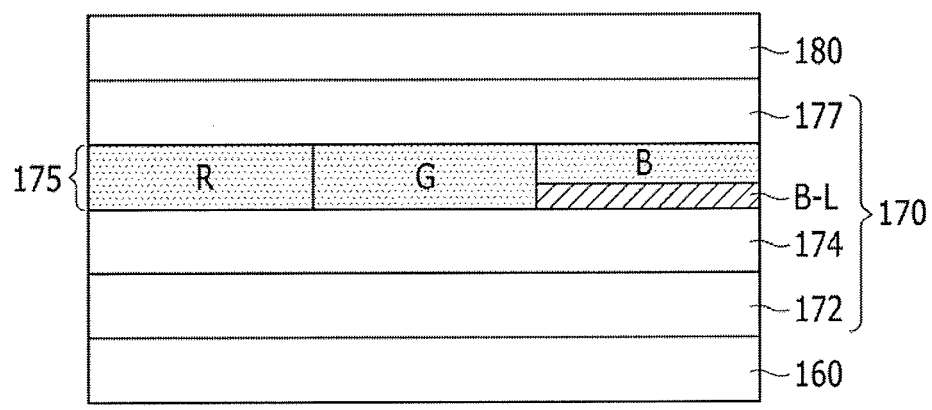
FIG. 4 illustrates a cross-sectional view of an example in which the organic light emitting diode of FIG. 2 is partially modified.

FIG. 4 illustrates a cross-sectional view of an example in which the organic light emitting diode of FIG. 2 is partially modified.

FIG. 4 illustrates a case in which the emission layer 175 in the organic light emitting diode (LD) described with reference to FIG. 2 is modified. For example, the emission layer 175 may include a red emission layer R, a green emission layer G, and a blue emission layer B, and an auxiliary layer B-L may be disposed at a lower end of the blue emission layer B to increase efficiency of the blue emission layer B. For example, the auxiliary layer B-L may be between the blue emission layer B and the first electrode 160.

In an implementation, the red emission layer R may have a thickness of, e.g., 30 nm to 50 nm, the green emission layer G may have a thickness of, e.g., 10 nm to 30 nm, and the blue emission layer B may have a thickness of, e.g., 10 nm to 30 nm. In an implementation, the red emission layer R and the green emission layer G may have about the same thickness. The auxiliary layer B-L at the lower end of the blue emission layer B may have a thickness of, e.g., 20 nm or less, or 1 nm to 20 nm. The auxiliary layer B-L may help control a hole charge balance to increase the efficiency of the blue emission layer B. In an implementation auxiliary layer B-L may include a compound represented by the following Chemical Formula 1.

Chemical Formula 1

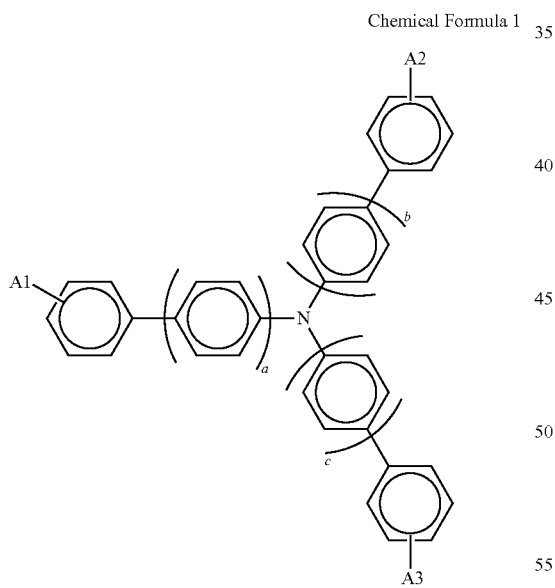

In Chemical Formula 1, A1, A2, and A3 may each independently include, e.g., an alkyl group, an aryl group, a carbazole group, a dibenzothiophene group, a dibenzofuran (DBF) group, or a biphenyl group, and a, b, and c may each independently be an integer of 0 to 4.

In an implementation, the compound represented by the above Chemical Formula 1 may include a compound represented by one of the following Chemical Formulae 1-1, 1-2, 1-3, 1-4, 1-5, and 1-6.

Chemical Formula 1-1

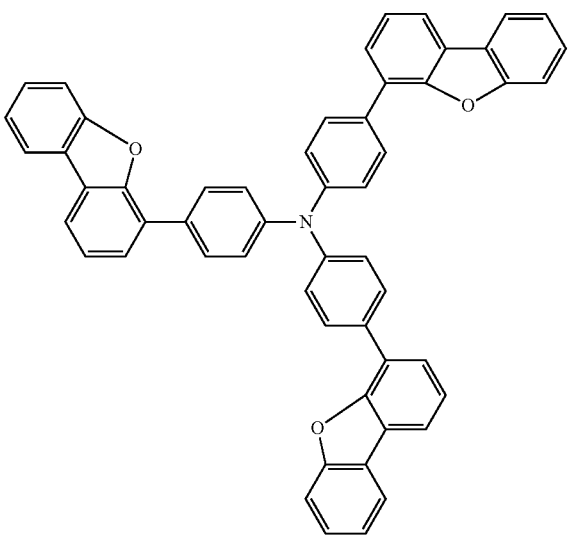

Chemical Formula 1-2

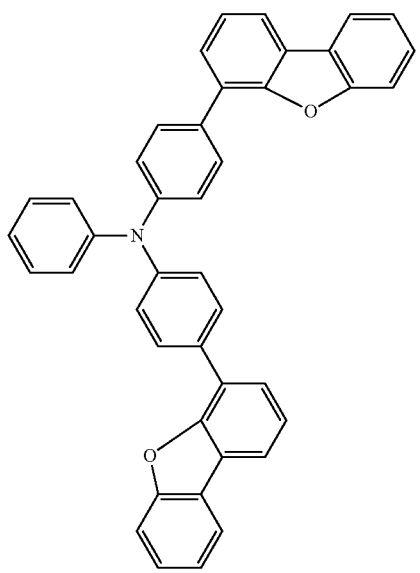

Chemical Formula 1-3

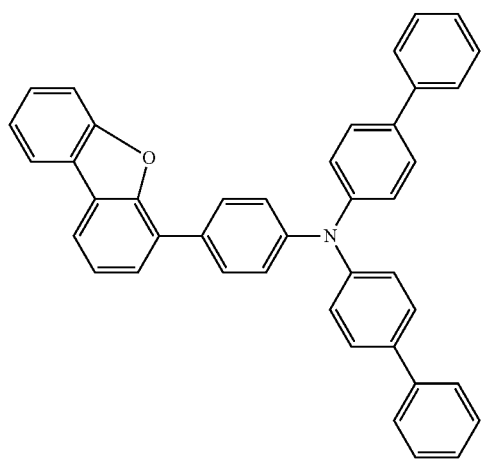

In an implementation, the auxiliary layer B-L may include a compound represented by the following Chemical Formula 2.

Chemical Formula 1-4

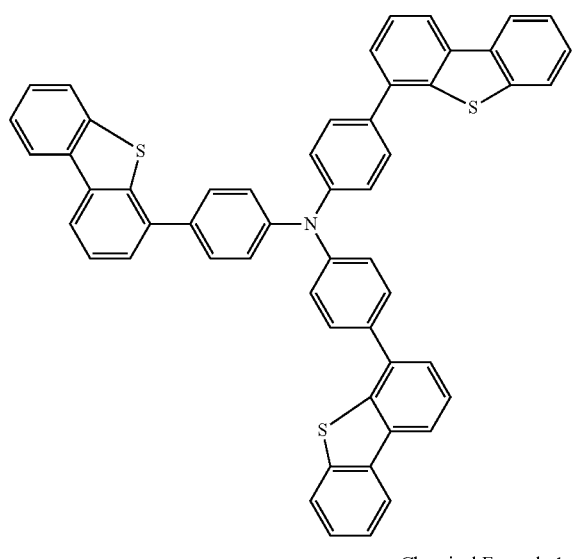

Chemical Formula 1-5

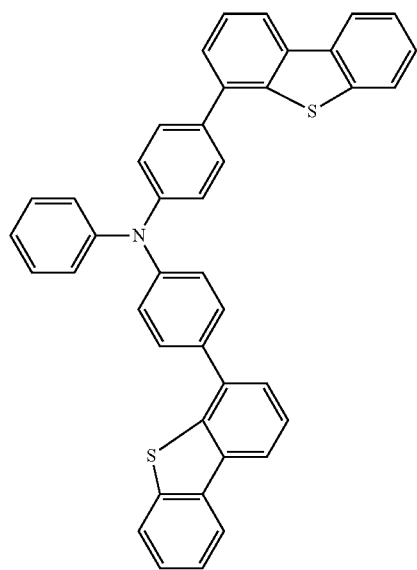

Chemical Formula 1-6

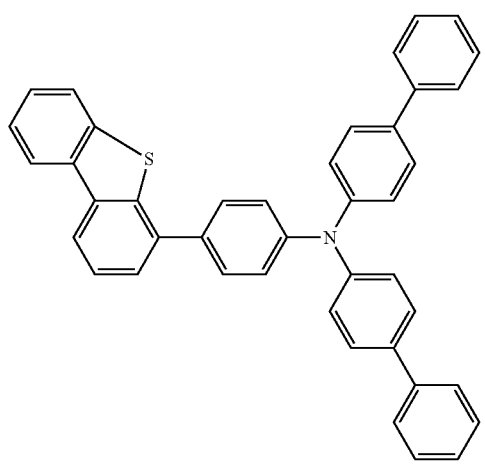

Chemical Formula 2

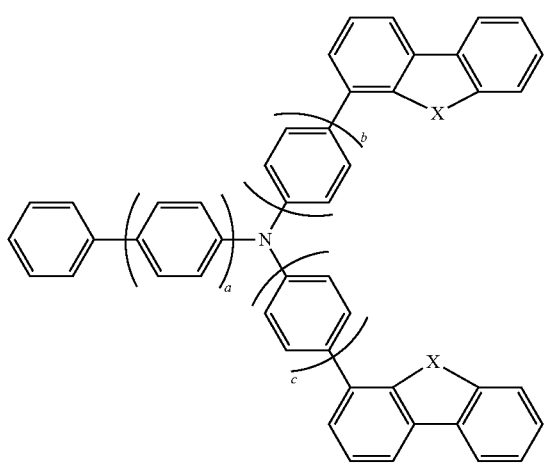

In Chemical Formula 2, a, b, and c may each independently be an integer of 0 to 3, each X may independently be selected from O, N, or S.

In an implementation, the compound represented by the Chemical Formula 2 may include a compound represented by one of the following Chemical Formulas 2-1 to 2-6.

Chemical Formula 2-1

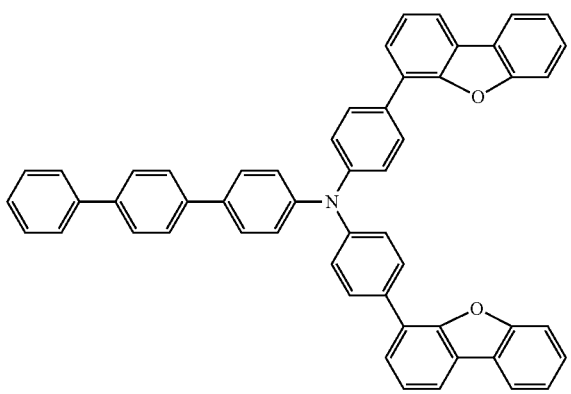

Chemical Formula 2-2
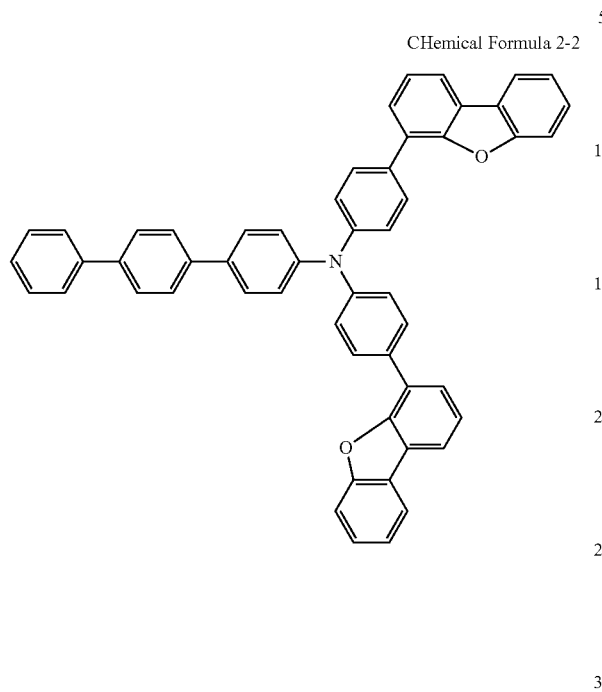
Chemical Formula 2-4
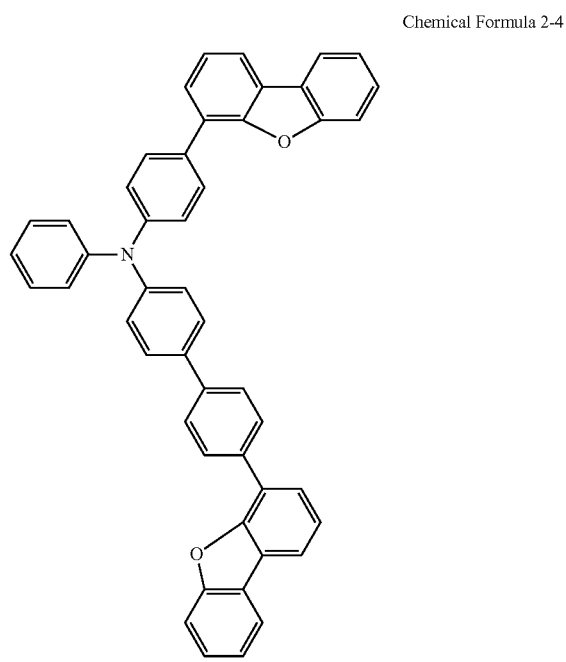 [SMILES: c1ccc(N(c2ccc(-c3ccc(-c4cccc5c4sc4ccccc45)cc3)cc2)c2ccc(-c3cccc4c3sc3ccccc34)cc2)cc1]
Chemical Formula 2-3
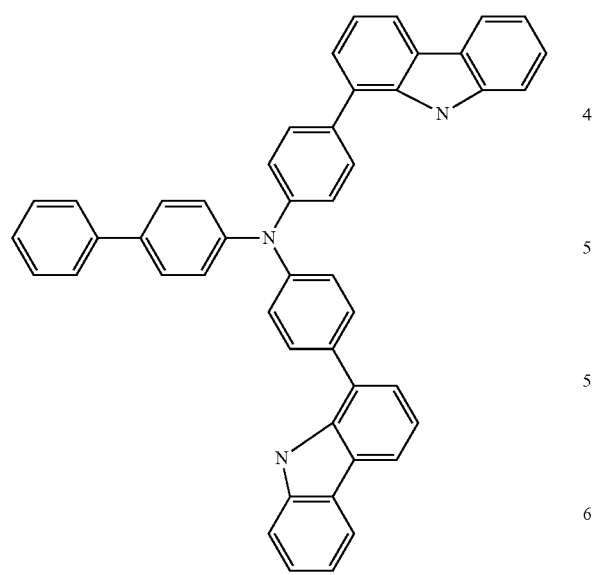
Chemical Formula 2-5
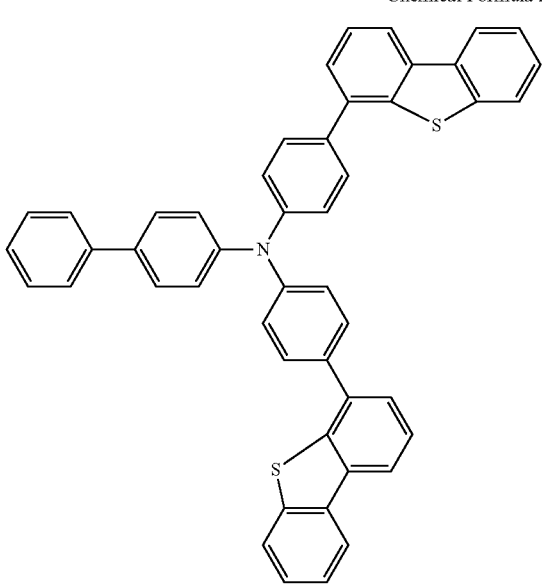

Chemical Formula 2-6

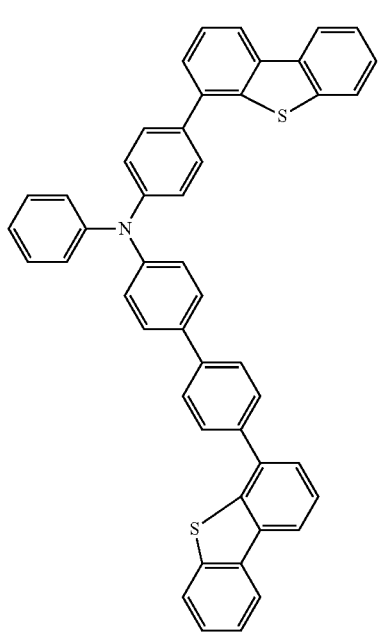

In an implementation, the auxiliary layer B-L may include a compound represented by the following Chemical Formula 3.

Chemical Formula 3

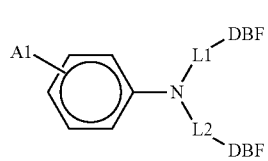

In Chemical Formula 3, A1 may include, e.g., an alkyl group, an aryl group, a carbazole group, a dibenzothiophene group, or a dibenzofuran (DBF) group, L1 and L2 may each independently be

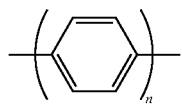

(in which n is 0 to 3), and the DBF connected to the L1 and L2 may each independently be substituted into the carbazole or the dibenzothiophene.

Hereinafter, a synthetic method of the auxiliary layer B-L according to the exemplary embodiment will be described below. For example, the synthetic method of a compound represented by the following Chemical Formula 1-1 will be described below.

Chemical Formula 1-1

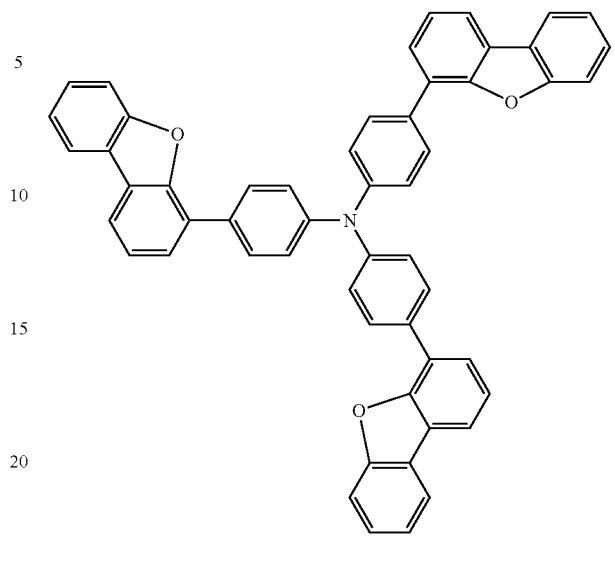

Synthesis Example

Under an argon atmosphere, 6.3 g of 4-dibenzofuranboronic acid, 4.8 g of 4,4',4"-tribromotriphenylamine, 104 mg of tetrakis(triphenylphosphine) palladium ($Pd(PPh_3)_4$), 48 ml of a 2 M sodium carbonate ($Na_2CO_3$) solution, and 48 ml of toluene were put into a 300 ml three neck distillation flask and then reacted at 80° C. for 8 hours. A reaction solution was extracted using toluene/water and dried by anhydrous sodium sulfate. It was concentrated under reduced pressure and the acquired crude products were column purified, thereby acquiring 3.9 g of yellow white powder.

In an implementation, referring to FIG. 4, the red emission layer R and the green emission layer G may be formed of a single layer, and the blue emission layer B and the auxiliary layer B-L may be formed of a double layer.

In an implementation, an auxiliary layer for a resonance structure may also be formed at lower ends of the red emission layer R and/or the green emission layer G.

In an implementation, like the exemplary embodiment with reference to FIG. 3, the electron injection layer 179 may also be formed between the second electrode 180 and the electron transport layer 177.

In addition to the foregoing difference, the content described with reference to FIG. 2 may be applied to the exemplary embodiment of FIG. 4.

Figure 5:
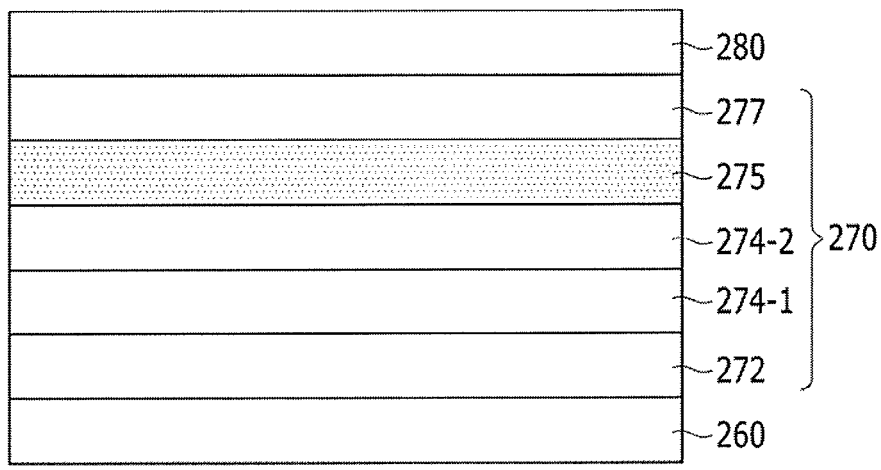
FIG. 5 illustrates a cross-sectional view of a modified example of the organic light emitting diode of FIG. 2.

FIG. 5 illustrates a cross-sectional view of a modified example of the organic light emitting diode of FIG. 2.

Referring to FIG. 5, the organic light emitting diode according to the exemplary embodiment may include a first electrode 260, a light emitting device layer 270, and a second electrode 280. A hole injection layer 272 on the first electrode 260 may include the organic material and the dipole material (in which the third component and the fourth component having different polarities as described in the exemplary embodiment of FIG. 2 are combined with each other). Here, the third component may include a metal or a non-metal and may have a work function of 4.0 eV or more and the fourth component may include a halogen. The metal materials or other elements having a high work function may be introduced to help reduce the hole injection barrier of the first electrode 260 and the hole transport layer 274.

Further, the organic light emitting diode (LD) according to the exemplary embodiment may help prevent a reduction in light emitting characteristics due to an Ag material passing through the crystalline ITO and being transferred to the organic material layer when the first electrode 260 is made of ITO/Ag/ITO since the hole injection layer 272 (including, e.g., RbI or the like) may be disposed on the first electrode 260 in a thin film form of an amorphous material.

The metal materials having the work function of 4.0 eV or more (high work function) included in the hole injection layer 272 may be include an element selected from, e.g., Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, In, and Zn.

A dipole moment of the third component and the fourth component of the dipole material included in the hole injection layer 272 may be, e.g., 5 Debye or more. The third component may include, e.g., an alkali metal, an alkaline earth metal, a rare earth element, and/or a transition metal (e.g., on a periodic table) or an alloy thereof. The fourth component may include, e.g., a halogen. In an implementation, the third component may have a work function of 3.0 eV or less and may include at least one selected from, e.g., Li, Na, K, Rb, Cs, Ca, Sr, Ba, Ce, Sm, Eu, Gd, and Yb and/or an alloy thereof.

The hole transport layer 274 on the hole injection layer 272 may have a multi-layered structure of a first hole transport layer 274-1 and a second hole transport layer 274-2. In this case, the first hole transport layer 274-1 may include a pure organic material (that is not co-deposited) and the second hole transport layer 274-2 may include a layer in which the organic material and the dipole material are co-deposited. In an implementation, the first hole transport layer 274-1 and the second hole transport layer 274-2 may be modified to a layer of three layers or more which are alternately stacked repeatedly.

The content described with reference to FIG. 2 may be applied to the emission layer 275, the electron transport layer 277, and the second electrode 280 which are formed on the hole transport layer 274.

Figure 6:
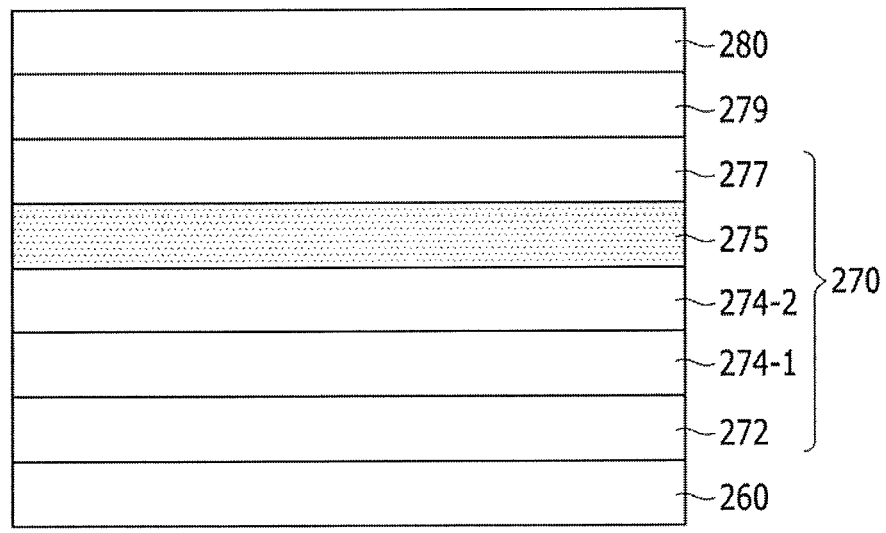
FIG. 6 illustrates a cross-sectional view of an example in which the organic light emitting diode of FIG. 5 is partially modified.

FIG. 6 illustrates a cross-sectional view of an example in which the organic light emitting diode of FIG. 5 is partially modified.

FIG. 6 illustrates a structure in which the organic light emitting diode (LD) according to the exemplary embodiment of FIG. 5 further includes an electron injection layer 279. According to the exemplary embodiment, the electron injection layer 279 may be disposed between the electron transport layer 277 and the second electrode 280. The electron injection layer 279 may facilitate injection of electrons from the second electrode 280 into the electron transport layer 277. According to the exemplary embodiment, the electron injection layer 279 may include the metal materials having the low work function. The work function of the metal material forming the electron injection layer 279 may be equal to or less than 3.0 eV. For example, the electron injection layer 279 may include an alkali metal, alkaline earth metal, rare earth element, alkali metal oxide, alkaline earth metal oxide, rare earth oxide, or an alloy thereof. In an implementation, the electron injection layer 279 may include at least one selected from, e.g., Li, Na, K, Rb, Cs, Ca, Sr, Ba, Ce, Sm, Eu, Gd, and Yb and/or an alloy thereof.

In addition to the foregoing difference, the content described with reference to FIG. 5 may be applied to the exemplary embodiment of FIG. 6.

Figure 7:
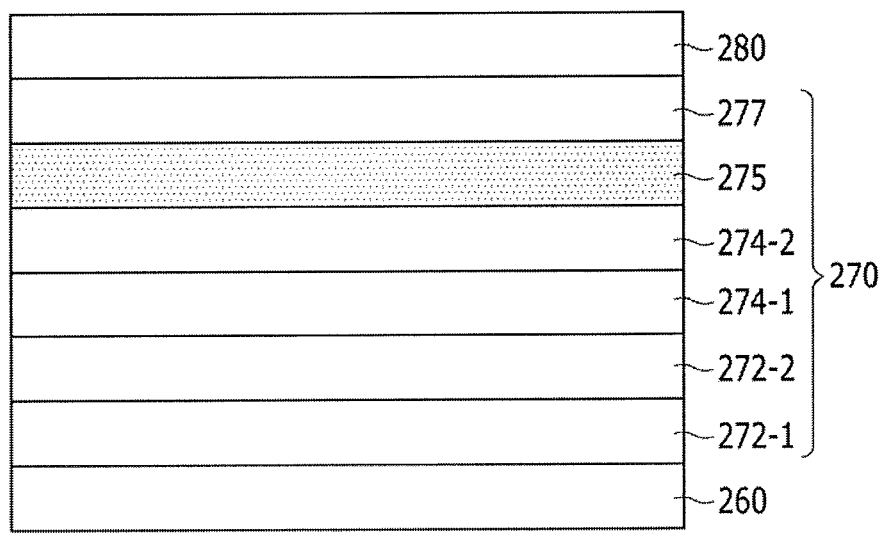
FIG. 7 illustrates a cross-sectional view of an example in which the organic light emitting diode of FIG. 5 is partially modified.

FIG. 7 illustrates a cross-sectional view of an example in which the organic light emitting diode of FIG. 5 is partially modified.

FIG. 7 illustrates a structure in which the hole injection layer 272 is formed in two layers in the organic light emitting diode (LD) according to the exemplary embodiment of FIG. 5. According to the exemplary embodiment, the hole injection layer 272 may include a first hole injection layer 272-1 and a second hole injection layer 272-2. The first hole injection layer 272-1 may include a pure organic material (that is not co-deposited) and the second hole injection layer 272-2 may include a layer in which the organic material and the dipole material are co-deposited. In an implementation, the first hole injection layer 272-1 and the second hole injection layer 272-2 may be modified to a layer of three layers or more which are alternately stacked repeatedly.

In addition to the foregoing difference, the content described with reference to FIG. 5 may be applied to the exemplary embodiment of FIG. 7.

Figure 8:
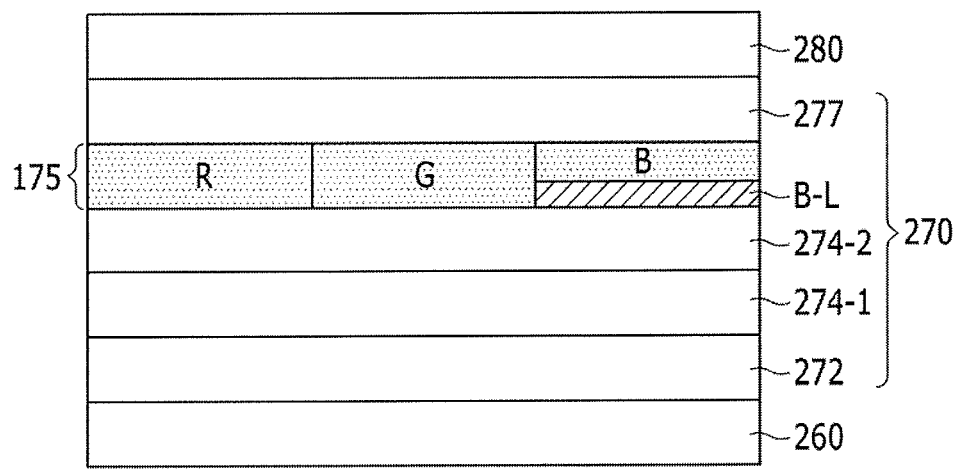
FIG. 8 illustrates a cross-sectional view of an example in which the organic light emitting diode of FIG. 5 is partially modified.

FIG. 8 illustrates a cross-sectional view of an example in which the organic light emitting diode of FIG. 5 is partially modified.

FIG. 8 illustrates a can in which the emission layer 275 in the organic light emitting diode (LD) described with reference to FIG. 5 is modified. For example, according to the exemplary embodiment, the emission layer 275 may include a red emission layer R, a green emission layer G, and a blue emission layer B, and an auxiliary layer B-L may be disposed at a lower end of the blue emission layer B to help increase efficiency of the blue emission layer B. For example, the auxiliary layer B-L may be between the blue emission layer B and the first electrode 260.

The content described with reference to FIG. 4 may be applied to the red emission layer R, the green emission layer G, and the blue emission layer B, and the auxiliary layer B-L which is disposed at the lower end of the blue emission layer B.

In an implementation, referring to FIG. 8, the red emission layer R and the green emission layer G may be formed as a single layer, and thus the blue emission layer B and the auxiliary layer B-L may be formed of a double layer.

In an implementation, an auxiliary layer may also be formed at the lower ends of the red emission layer R and/or the green emission layer G.

In an implementation, like the exemplary embodiment with reference to FIG. 6, the electron injection layer 279 may also be formed between the second electrode 280 and the electron transport layer 277.

In addition to the foregoing difference, the content described with reference to FIG. 5 may be applied to the exemplary embodiment of FIG. 8.

By way of summation and review, some organic light emitting display devices may have a high driving voltage, low luminous brightness or luminous efficiency, and short luminous life.

The embodiments may provide an organic light emitting diode and an organic light emitting display device including the same having advantages of high efficiency and long life.

According to an exemplary embodiment, it is possible to increase the luminous efficiency by forming the hole transport layer or the hole injection layer including the organic material and the dipole material based on the high work function.

According to an exemplary embodiment, it is possible to increase the luminous efficiency of the blue emission layer by forming the auxiliary layer at the lower end of the blue emission layer.

Example embodiments have been disclosed herein, and although specific terms are employed, they are used and are

DESCRIPTION OF SYMBOLS

| 160, 260 | First electrode | 172, 272 | Hole injection layer |
| 174, 274 | Hole transport layer | 175, 275 | Emission layer |
| 177, 277 | Electron transport layer | 179, 279 | Electron injection layer |
| 180, 280 | Second electrode | B-L | Auxiliary layer |

What is claimed is:

1. An organic light emitting diode, comprising:
a first electrode and a second electrode facing each other;
an emission layer between the first electrode and the second electrode; and
a hole transfer layer between the first electrode and the emission layer,
wherein the hole transfer layer includes an organic material and an inorganic dipole material, the dipole material including a first component and a second component, the first component having a polarity different from that of the second component and the first component and the second component being combined with each other.

2. The organic light emitting diode as claimed in claim 1, wherein:
the first component includes a metal or a non-metal and has a work function of 4.0 eV or more, and
the second component includes a halogen.

3. The organic light emitting diode as claimed in claim 2, wherein the first component includes an element selected from Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, In, and Zn.

4. The organic light emitting diode as claimed in claim 3, wherein the second component includes an element selected from F, Cl, Br, and I.

5. The organic light emitting diode as claimed in claim 4, wherein the dipole material includes one selected from $NiI_2$, $CoI_2$, $CuI$, $AgI$, $SnI_2$, and $InI_3$.

6. The organic light emitting diode as claimed in claim 2, further comprising an electron injection layer between the emission layer and the second electrode,
wherein the electron injection layer has a work function of 3.0 eV or less, and includes at least one selected from an alkali metal, an alkaline earth metal, a rare earth element, a transition metal, or an alloy thereof.

7. The organic light emitting diode as claimed in claim 6, wherein the electron injection layer includes at least one selected from Li, Na, K, Rb, Cs, Ca, Sr, Ba, Ce, Sm, Eu, Gd, Yb, and an alloy thereof.

8. The organic light emitting diode as claimed in claim 1, wherein a dipole moment of the first component and the second component is 5 Debye or greater.

9. The organic light emitting diode as claimed in claim 8, wherein:
the first component includes at least one selected from an alkali metal, an alkaline earth metals, a rare earth element, a transition metal, and an alloy thereof, and
the second component includes a halogen.

10. The organic light emitting diode as claimed in claim 9, wherein the first component has a work function of 3.0 eV or less, and includes at least one selected from Li, Na, K, Rb, Cs, Ca, Sr, Ba, Ce, Sm, Eu, Gd, and Yb, and an alloy thereof.

11. The organic light emitting diode as claimed in claim 1, wherein the hole transfer layer includes at least one of a hole injection layer and a hole transport layer, the hole injection layer between the first electrode and the hole transport layer.

12. The organic light emitting diode as claimed in claim 1, wherein:
the hole transfer layer has a structure formed of a plurality of layers and when the organic material and the dipole material each are a first material and a second material, the plurality of layers each comprise at least one of the first material and the second material.

13. The organic light emitting diode as claimed in claim 1, wherein the hole transfer layer is formed by a co-depositing the organic material and the dipole material.

14. An organic light emitting display device, comprising:
a substrate,
a thin film transistor,
an organic light emitting diode on the thin film transistor,
wherein the organic light emitting diode includes:
a first electrode and a second electrode facing each other;
an emission layer between the first electrode and the second electrode; and
a hole transfer layer between the first electrode and the emission layer, and
wherein:
the hole transfer layer includes an organic material and a dipole material,
the dipole material includes a first component and a second component,
the first component has a polarity different from that of the second component, the first component and the second component being combined with each other,
the emission layer includes a red emitting layer, a green emitting layer, and a blue emitting layer, and
the emission layer further includes an auxiliary layer disposed at a lower end of the blue emitting layer.

15. The organic light emitting display device as claimed in claim 14, wherein the first component includes a metal or a non-metal, the metal or non-metal having a work function of 4.0 eV or more, and the second component includes halogen.

16. The organic light emitting display device as claimed in claim 15, wherein the first component includes an element selected from Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, In, and Zn.

17. The organic light emitting display device as claimed in claim 16, wherein the second component includes an element selected from F, Cl, Br, and I.

18. The organic light emitting display device as claimed in claim 17, wherein the dipole material includes one selected from $NiI_e$, $CoI_2$, $CuI$, $AgI$, $SnI_2$, and $InI_3$.

19. The organic light emitting display device as claimed in claim 14, wherein a dipole moment of the first component and the second component is 5 Debye or greater.

20. The organic light emitting display device as claimed in claim 19, wherein:
the first component includes at least one selected from an alkali metal, an alkaline earth metals, a rare earth element, a transition metal, and an alloy thereof, and the second component includes a halogen.

21. The organic light emitting display device as claimed in claim 20, wherein the first component has a work function of 3.0 eV or less, and includes at least one selected from Li, Na, K, Rb, Cs, Ca, Sr, Ba, Ce, Sm, Eu, Gd, and Yb, and an alloy thereof.

22. The organic light emitting display device as claimed in claim 14, wherein the auxiliary layer includes a compound represented by the following Chemical Formula 1:

Chemical Formula 1

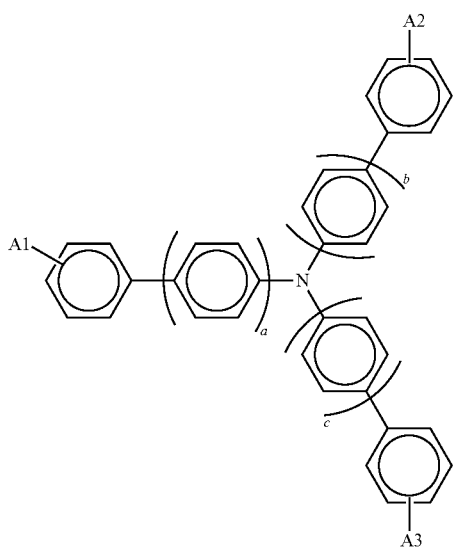

wherein, in Chemical Formula 1,
A1, A2, and A3 each independently include an alkyl group, an aryl group, a carbazole group, a dibenzothiophene group, a dibenzofuran group, or a biphenyl group, and
a, b, and c are each independently an integer of 0 to 4.

23. The organic light emitting display device as claimed in claim 14, wherein the auxiliary layer includes a compound represented by the following Chemical Formula 2:

Chemical Formula 2

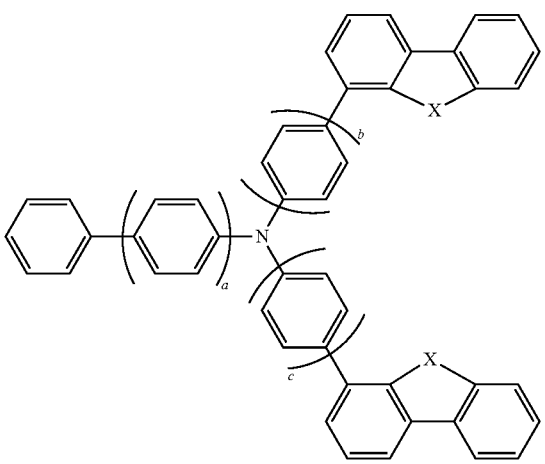

wherein, in Chemical Formula 2,
a, b, and c are each independently an integer of 0 to 3, and each X is independently selected from O, N, and S.

24. The organic light emitting display device as claimed in claim 14, wherein:
the hole transfer layer has a structure formed of a plurality of layers and when the organic material and the dipole material each are a first material and a second material, the plurality of layers each comprise at least one of the first material and the second material.

* * * * *